(12) United States Patent
Li et al.

(10) Patent No.: US 11,257,852 B2
(45) Date of Patent: Feb. 22, 2022

(54) CIRCUIT BACKPLANE OF DISPLAY PANEL, METHOD FOR MANUFACTURING THE CIRCUIT BACKPLANE, AND DISPLAY PANEL

(71) Applicant: BOE TECHNOLOGY GROUP CO., LTD., Beijing (CN)

(72) Inventors: Haixu Li, Beijing (CN); Zhanfeng Cao, Beijing (CN); Ke Wang, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 16/966,146

(22) PCT Filed: Dec. 25, 2019

(86) PCT No.: PCT/CN2019/128125
§ 371 (c)(1),
(2) Date: Jul. 30, 2020

(87) PCT Pub. No.: WO2020/173202
PCT Pub. Date: Sep. 3, 2020

(65) Prior Publication Data
US 2021/0233940 A1    Jul. 29, 2021

(30) Foreign Application Priority Data
Feb. 28, 2019   (CN) .......................... 201910149604.5

(51) Int. Cl.
*H01L 27/12*    (2006.01)
*H01L 25/16*    (2006.01)
(Continued)

(52) U.S. Cl.
CPC .......... *H01L 27/1248* (2013.01); *H01L 24/32* (2013.01); *H01L 25/167* (2013.01);
(Continued)

(58) Field of Classification Search
CPC ... H01L 27/1248; H01L 24/32; H01L 25/167; H01L 27/124; H01L 27/1259;
(Continued)

(56) References Cited

U.S. PATENT DOCUMENTS

| 10,707,266 B2 * | 7/2020 | Chang | ...................... H01L 33/62 |
| 2013/0285086 A1 * | 10/2013 | Hu | .......................... H01L 24/95 257/98 |

(Continued)

FOREIGN PATENT DOCUMENTS

| CN | 1350420 A | 5/2002 |
| CN | 1819742 A | 8/2006 |

(Continued)

OTHER PUBLICATIONS

China Patent Office, First Office Action dated Jul. 24, 2020 for application No. CN201910149604.5.

*Primary Examiner* — Bo B Jang
(74) *Attorney, Agent, or Firm* — Houtteman Law LLC

(57) ABSTRACT

A circuit backplane of a display panel, a method for manufacturing the same, and a display panel are provided. The circuit backplane includes a substrate and a plurality of circuit regions on the substrate. Each of the plurality of circuit regions includes a cathode soldered electrode, an anode soldered electrode, and a flow blocking island that are on the substrate. The flow blocking island is between the cathode soldered electrode and the anode soldered electrode, and in a thickness direction of the circuit backplane, a height of the flow blocking island is greater than each of a height
(Continued)

of the cathode soldered electrode and a height of the anode soldered electrode.

12 Claims, 4 Drawing Sheets

(51) Int. Cl.
    *H01L 33/62*     (2010.01)
    *H01L 23/00*     (2006.01)

(52) U.S. Cl.
    CPC ........ *H01L 27/124* (2013.01); *H01L 27/1259* (2013.01); *H01L 33/62* (2013.01); *H01L 2224/26145* (2013.01); *H01L 2224/32145* (2013.01); *H01L 2924/12041* (2013.01)

(58) Field of Classification Search
    CPC .......... H01L 33/62; H01L 2224/26145; H01L 2224/32145; H01L 2924/12041; H01L 25/0753; H01L 27/153; H01L 33/20; F21K 9/00
    USPC ........................ 257/88–89, 99, 100, E33.001
    See application file for complete search history.

(56) References Cited

U.S. PATENT DOCUMENTS

| | | | |
|---|---|---|---|
| 2013/0313590 A1* | 11/2013 | Akimoto | H01L 33/502 |
| | | | 257/98 |
| 2014/0239331 A1* | 8/2014 | Oyu | H01L 33/505 |
| | | | 257/98 |
| 2018/0197461 A1 | 7/2018 | Lai et al. | |

FOREIGN PATENT DOCUMENTS

| | | |
|---|---|---|
| CN | 102237470 A | 11/2011 |
| CN | 102842666 A | 12/2012 |
| CN | 103366763 A | 10/2013 |
| CN | 107170773 A | 9/2017 |
| CN | 108091753 A | 5/2018 |
| CN | 109166469 A | 1/2019 |
| CN | 109326612 A | 2/2019 |
| CN | 109904174 A | 6/2019 |
| TW | 201828517 A | 8/2018 |

\* cited by examiner

US 11,257,852 B2

CIRCUIT BACKPLANE OF DISPLAY PANEL, METHOD FOR MANUFACTURING THE CIRCUIT BACKPLANE, AND DISPLAY PANEL

CROSS REFERENCE TO RELATED APPLICATIONS

This is a National Phase Application filed under 35 U.S.C. 371 as a national stage of PCT/CN2019/128125, filed on Dec. 25, 2019, an application claiming the priority of Chinese patent application No. 201910149604.5, filed on Feb. 28, 2019, the content of each of which is incorporated herein in its entirety by reference.

TECHNICAL FIELD

The present disclosure relates to the technical field of display panels, and in particular, to a circuit backplane of a display panel, a method for manufacturing a circuit backplane of a display panel, and a display panel.

BACKGROUND

Micro light-emitting diodes (LEDs) may be formed by thinning, miniaturizing, and arraying LEDs, next transferring the resultant (arrayed) LEDs to a circuit backplane in batches, and then forming a protection layer and an electrode to encapsulate the circuit backplane. As compared with the related OLED technologies, the formed micro LEDs have advantages of higher brightness, higher light-emitting efficiency, and lower power consumption.

SUMMARY

In a first aspect, embodiments of the present disclosure provide a circuit backplane of a display panel, the circuit backplane including a substrate and a plurality of circuit regions on the substrate, wherein each of the plurality of circuit regions includes a cathode soldered electrode, an anode soldered electrode, and a flow blocking island that are on the substrate; and the flow blocking island is between the cathode soldered electrode and the anode soldered electrode, and in a thickness direction of the circuit backplane, a height of the flow blocking island is greater than each of a height of the cathode soldered electrode and a height of the anode soldered electrode.

In the embodiments of the present disclosure, the flow blocking island is provided between the cathode soldered electrode and the anode soldered electrode on the circuit backplane, and in the thickness direction of the circuit backplane, a height of the flow blocking island is greater than each of a height of the cathode soldered electrode and a height of the anode soldered electrode. As such, the flow blocking island can block the flowing of the silver paste used for soldering an anode and a cathode of each micro LED during formation of a display panel, so as to avoid short circuit caused by the connection of the anode and the cathode due to the flowing of the silver paste.

In a possible embodiment, each of the plurality of circuit regions further includes: a drive circuit on the substrate, a planarization layer between the drive circuit and a layer where the cathode soldered electrode and the anode soldered electrode are located, and an electrode protection layer on the layer where the cathode soldered electrode and the anode soldered electrode are located;

wherein the flow blocking island includes a protruding portion of the planarization layer between the cathode soldered electrode and the anode soldered electrode, and a portion of the electrode protection layer on the protruding portion.

In an embodiment of the present disclosure, the flow blocking island can be formed by the planarization layer and the electrode protection layer on the substrate, and needs not being provided separately, thereby simplifying the manufacturing process thereof as much as possible.

In a possible embodiment, the protruding portion has slope surfaces proximal to the cathode soldered electrode and the anode soldered electrode, respectively.

In an embodiment of the present disclosure, the slope surfaces of the protruding portion that are proximal to the cathode soldered electrode and the anode soldered electrode, respectively, can increase a resistance to the flowing of the silver paste as much as possible.

In a possible embodiment, an angle between each of the slope surfaces and the substrate is in a range of [50°, 80°].

In an embodiment of the present disclosure, an angle between each of the slope surfaces and the substrate is in a range of [50°, 80°]. As such, a height of the flow blocking island in the thickness direction of the substrate is limited to facilitate soldering of each micro LED, while ensuring that the resistance to the flowing of the silver paste is as large as possible.

In a possible embodiment, the circuit backplane further includes a plurality of flow blocking grooves in a portion of the electrode protection layer on each slope surface.

In an embodiment of the present disclosure, a plurality of flow blocking grooves are formed in a portion of the electrode protection layer on each slope surface, which can further block the flowing of the silver paste.

In a possible embodiment, an orthographic projection of each of the plurality of flow blocking grooves on the substrate is a circular arc, a circle center of the circular arc of each of the flow blocking grooves on the slope surface proximal to the cathode soldered electrode is proximal to the cathode soldered electrode, and a circle center of the circular arc of each of the flow blocking grooves on the slope surface proximal to the anode soldered electrode is proximal to the anode soldered electrode.

In an embodiment of the present disclosure, each of the flow blocking grooves may be a groove formed in a portion of the electrode protection layer opposite to the cathode soldered electrode or the anode soldered electrode, and may be formed as an encircling circular arc, so as to block the flowing of the silver paste.

In a possible embodiment, the electrode protection layer has a thickness in a range of [3,500 Å, 6,500 Å].

In an embodiment of the present disclosure, a thickness of the electrode protection layer may be increased to about 5,000 Å relative to that of an electrode protection layer in the related art, such that each of the flow blocking grooves may have a large depth into the electrode protection layer, thereby improving the effect of blocking the flowing of the silver paste.

In a second aspect, embodiments of the present disclosure provide a method for manufacturing a circuit backplane of a display panel, the method including:

forming a driver circuit in each circuit region on a substrate;

forming a planarization layer on the driver circuit by using a half-mask process;

forming a cathode soldered electrode and an anode soldered electrode on the planarization layer; and forming an electrode protection layer on a layer where the cathode soldered electrode and the anode soldered electrode are located;

wherein the planarization layer has a protruding portion between the cathode soldered electrode and the anode soldered electrode, and the protruding portion and a portion of the electrode protection layer on the protruding portion form a flow blocking island.

In a possible embodiment, the forming an electrode protection layer on a layer where the cathode soldered electrode and the anode soldered electrode are located includes:

forming a plurality of flow blocking grooves in a portion of the electrode protection layer on each of slope surfaces of the protruding portion, wherein the slope surfaces are proximal to the cathode soldered electrode and the anode soldered electrode, respectively.

In a third aspect, embodiments of the present disclosure provide a display panel, including the circuit backplane according to any one of the embodiments of the first aspect and a plurality of micro LEDs, wherein an anode and a cathode of each of the plurality of micro LEDs are respectively fixed to the anode soldered electrode and the cathode soldered electrode in a corresponding circuit region of the circuit backplane by silver paste.

DETAILED DESCRIPTION

Figure 1:
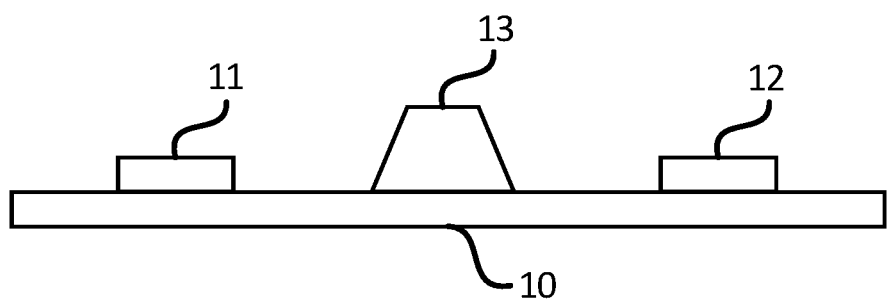
FIG. 1 is a schematic diagram showing a structure of a circuit backplane of a display panel according to an embodiment of the present disclosure.

To make objects, technical solutions and advantages of the present disclosure be more clearly understood, the technical solutions in exemplary embodiments of the present disclosure will be clearly and fully described below with reference to the drawings accompanying the exemplary embodiments of the present disclosure. It is to be understood that the exemplary embodiments described below are only for illustrating and explaining the present disclosure, but are not intended to limit the present disclosure. Further, the embodiments and features of the embodiments described herein may be combined with each other in a case where conflict does not occur. It should be noted that the thicknesses and shapes of the layers shown in the drawings are not necessarily drawn to true scale, but are merely illustrative of the present disclosure. Further, like or similar reference numerals refer to like or similar elements or elements having like or similar functions throughout the present disclosure.

The inventors of the present inventive concept found that, during the overall manufacturing process of the micro LEDs, a circuit backplane needs to be bonded to the micro LEDs after the circuit backplane is formed. Thus, soldering micro LED chips to the circuit backplane such as a thin film transistor (TFT) backplane is an important step. At present, the micro LED chips are soldered on the TFT backplane through reflow soldering, and an adhesive used for the reflow soldering is a silver adhesive. Since the silver adhesive has a good mobility, silver paste may flow to a position between a cathode and an anode during the reflow soldering, which may cause the cathode and the anode to be electrically connected to each other to result in short circuit. Therefore, it is desirable to provide a circuit backplane of a display panel, a method for manufacturing a circuit backplane of a display panel, and a display panel, which avoid the problem of short circuit that is likely to occur during the process of bonding the circuit backplane of the display panel to an LED in the related art.

In view of the foregoing, embodiments of the present disclosure provide a circuit backplane of a display panel, which can block flowing of silver paste and avoid connection between a cathode and an anode of a micro LED.

The circuit backplane of a display panel, the method for manufacturing a circuit backplane of a display panel, and the display panel according to the embodiments of the present disclosure will be described in detail below with reference to the accompanying drawings. The thicknesses and shapes of the various layers shown in the drawings are not necessarily drawn to true scale, but are merely illustrative of the present disclosure.

An embodiment of the present disclosure provides a circuit backplane of a display panel, as shown in FIG. 1 that is a schematic cross-sectional view of the circuit backplane taken along a thickness direction of the circuit backplane. The circuit backplane provided by the embodiment of the present disclosure includes a substrate 10, wherein a plurality of circuit regions are provided on the substrate 10. Each of the plurality of circuit regions includes a cathode soldered electrode 12, an anode soldered electrode 11, and a flow blocking island 13, which are positioned on the substrate 10. FIG. 1 shows one of the circuit regions as an example.

In the present embodiment, the flow blocking island 13 of each circuit region is located between the cathode soldered electrode 12 and the anode soldered electrode 11 of the circuit region, and in the thickness direction of the circuit backplane, a height of the flow blocking island 13 is greater than each of a height of the cathode soldered electrode 12 and a height of the anode soldered electrode 11. As such, the flow blocking island 13 may block the flowing of a soldering agent (e.g., the silver paste) between an anode and a cathode during the process of soldering a micro LED on the circuit backplane, so as to avoid short circuit caused by the connection of the anode and the cathode due to the flowing of the silver paste. In a possible embodiment, the flow blocking island 13 is located at a middle position (i.e., the center) between the cathode soldered electrode 12 and the anode soldered electrode 11, such that the flow blocking island 13 has the same flow blocking effect as possible on the silver pastes respectively flowing from the cathode soldered electrode 12 and from the anode soldered electrode 11. In the thickness direction of the circuit backplane, the height of the flow blocking island 13 is a range of [1 µm, 2 µm] (i.e., 1 µm≤the height of the flow blocking island 13≤2 µm), and is less than each of a height of the anode and a height of the cathode of a micro LED. As such, the flow blocking island 13 may block the flow of the silver paste while having no influence on the soldering of the micro LED.

Figure 2:
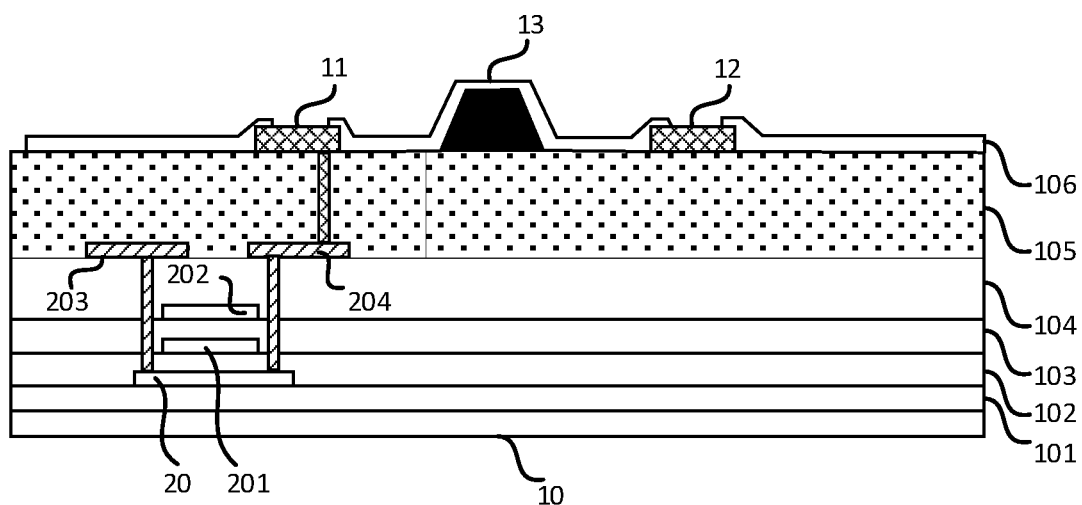
FIG. 2 is a schematic diagram showing a structure of a circuit backplane of a display panel according to an embodiment of the present disclosure.

Specifically, referring to FIG. 2, each circuit region may further include a driver circuit 20 located on the substrate 10, a planarization (PLN) layer located between the driver circuit 20 and a layer where the cathode soldered electrode 12 and the anode soldered electrode 11 are located, and an electrode protection layer 106 (which may be referred to as, for example, a PVX layer) located on the layer where the cathode soldered electrode 12 and the anode soldered electrode 11 are located. Further, each circuit region may further include other optional film layers of the circuit backplane of the display panel, for example, a buffer layer 101, a first insulating layer 102, a second insulating layer 103, and a dielectric layer 104 that are sequentially stacked on the substrate 10. A source 203 and a drain 204 are provided on the dielectric layer 104, and gates 201, 202 are provided on the first insulating layer 102 and the second insulating layer 103, respectively. The driver circuit 20 is located on a side of the buffer layer 101 distal to the substrate 10.

In a possible embodiment, the flow blocking island 13 according to the present embodiment of the present disclosure includes a protruding portion of the planarization layer 105 between the cathode soldered electrode 12 and the anode soldered electrode 11, and a portion of the electrode protection layer 106 on the protruding portion. As such, when the planarization layer 105 is formed, the flow blocking island 13 may be formed without separately providing a separate flow blocking island 13, thereby simplifying the manufacturing process of the circuit backplane as much as possible.

Continuing reference to FIG. 2, the flow blocking island 13 (e.g., the protruding portion) has slope surfaces proximal to the cathode soldered electrode 12 and the anode soldered electrode 11, respectively, such that a shape of a cross-section of the flow blocking island 13 taken along the thickness direction of the circuit backplane includes a trapezoid, so as to increase the resistance to the flow of the silver paste as much as possible.

In a possible embodiment, an angle α between each of the slope surfaces and the substrate 10 is small, such that the height of the flow blocking island 13 in the thickness direction of the circuit backplane is small, and the effect of blocking the flowing of the silver paste is poor. On the other hand, if the angle α is too large, the height of the flow blocking island 13 in the thickness direction of the circuit backplane may be too great, and may be greater than the heights of the cathode and the anode of a micro LED, such that the difficulty in soldering the micro LED is increased. Therefore, in an embodiment of the present disclosure, the angle α between each of the slope surfaces and the substrate 10 is in the range of [50°, 80°] (i.e., 50°≤α≤80°), such that the height of the flow blocking island 13 in the thickness direction of the substrate 10 is limited so as to facilitate the soldering of the micro LED, while ensuring that the resistance for blocking the flowing of the silver paste is as large as possible.

Figure 3:
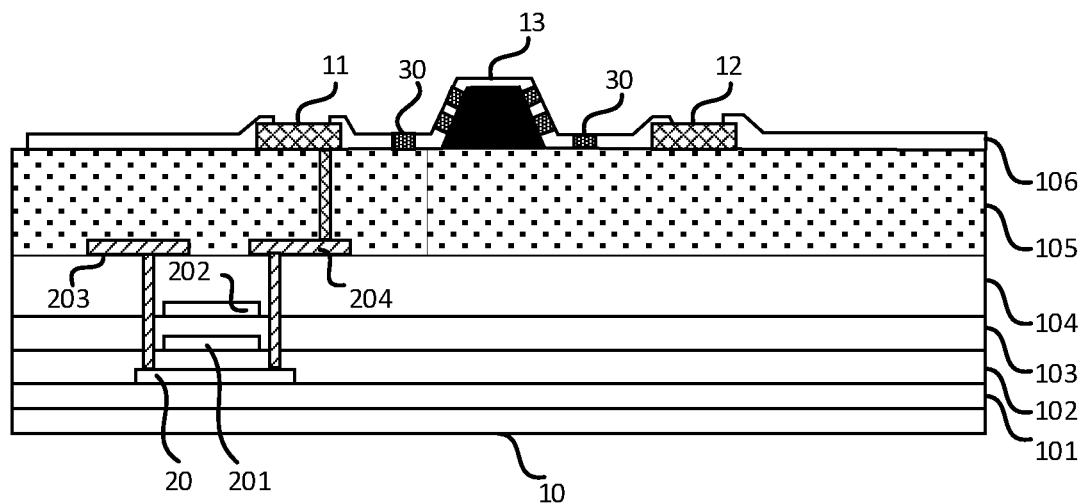
FIG. 3 is a schematic diagram showing a structure of a circuit backplane of a display panel according to an embodiment of the present disclosure.

In order to further enhance the effect of blocking the flowing of the silver paste, in an embodiment of the present disclosure, a plurality of flow blocking grooves 30 is provided in a portion of the electrode protection layer 106 on each of the slope surfaces, as shown in FIG. 3.

Figure 4:
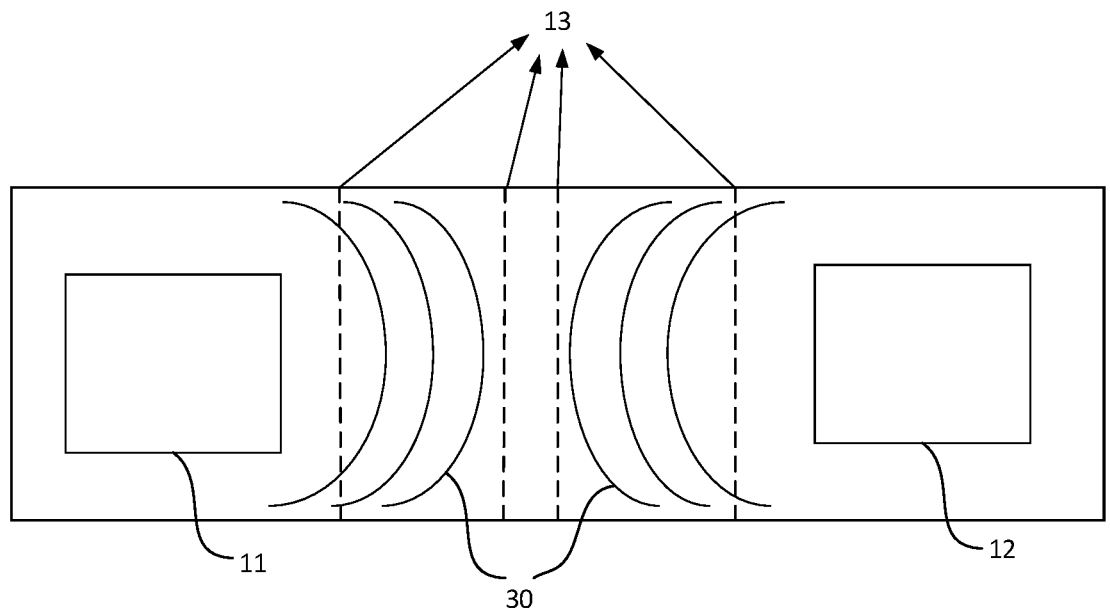
FIG. 4 is a schematic diagram showing a structure of a circuit backplane of a display panel according to an embodiment of the present disclosure.

Specifically, referring to FIG. 4, in a possible embodiment, an orthographic projection of each of the plurality of flow blocking grooves 30 on the substrate 10 is a circular arc. Further, a circle center of the circular arc of each of the flow blocking grooves 30 disposed on the slope surface proximal to the cathode soldered electrode 12 is proximal to the cathode soldered electrode 12, and a circle center of the circular arc of each of the flow blocking grooves 30 disposed on the slope surface proximal to the anode soldered electrode 11 is proximal to the anode soldered electrode 11. In FIG. 4, the dashed lines represent the projection of the top of the flow blocking island distal to the substrate and the projection of the bottom of the flow blocking island proximal to the substrate, on the substrate, respectively.

Figure 5:
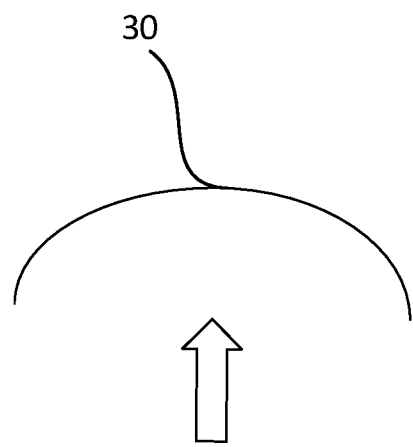
FIG. 5 is a schematic diagram showing a structure of a circuit backplane of a display panel according to an embodiment of the present disclosure.

In an embodiment of the present disclosure, each of the flow blocking grooves 30 may be a groove formed in a portion of the electrode protection layer 106 opposite to the cathode soldered electrode 12 or the anode soldered electrode 11, and may be formed as an encircling circular arc, so as to block the flowing of the silver paste. The principle that each of the flow blocking grooves 30 can block the flowing of the silver paste is that, the encircling circular arc is a reverse arc that surrounds a flow direction of liquid, and the reverse arc can block the flowing of the liquid upon being in contact with the liquid. Specifically, referring to FIG. 5 that is a schematic diagram showing the movement of the liquid relative to the flow blocking groove 30, during the flowing of the liquid, upon the liquid encounters the circular arc of the flow blocking groove 30, the flow blocking groove 30 will generate a large resistance to the liquid. An internal flowing inertia force of the liquid is consumed due to the existence of the resistance of the flow blocking groove 30, such that the flowing of the liquid may be slowed down. Thus, the addition of the flow blocking grooves 30 according to the present embodiment of the present disclosure can enhance the effect of blocking the flowing of the silver paste. The direction indicated by the arrow shown in FIG. 5 represents the flow direction of the liquid.

Figure 6:
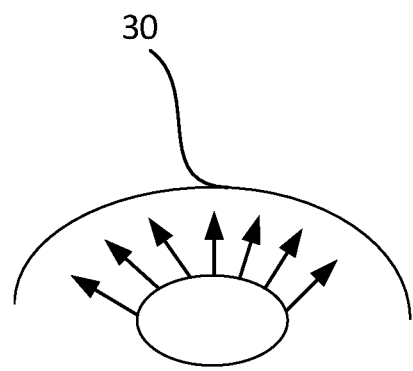
FIG. 6 is a schematic diagram showing a structure of a circuit backplane of a display panel according to an embodiment of the present disclosure.

Further, referring to FIG. 6 that is another schematic diagram of the movement of the liquid relative to the flow blocking groove 30, most of contacts between the liquid and the flow blocking groove 30 in different directions are right-angle contacts. In this case, a flow force of the liquid is consumed by the flowing of the liquid, and the resistance to the flowing of the liquid is increased by the flow blocking groove 30, which further consumes the flow force of the liquid itself. The directions indicated by the arrows shown in FIG. 6 represent the flow directions of liquid.

In a possible embodiment, a thickness of the electrode protection layer 106 is in the range of [3,500 Å, 6,500 Å] (i.e., 3,500 Å≤the thickness of the electrode protection layer 106≤6,500 Å), and may be about 5,000 Å. Thus, as compared with an electrode protection layer having a thickness of about 2000 Å in the related art, the electrode protection layer 106 according to an embodiment of the present disclosure has a greater thickness, such that each of the flow blocking grooves 30 may have a large depth into the electrode protection layer 106, thereby improving the effect of blocking the flowing of the silver paste. Optionally, a size of an opening of each of the flow blocking grooves 30 may be in a range of 2 μm to 10 μm, such that the flow force of the silver paste is consumed as much as possible.

In the above embodiments of the present disclosure, an example in which each circuit region includes one flow blocking island 13 has been described. In a practical application, a distance between the cathode soldered electrode 12 and the anode soldered electrode 11 is about 80 μm; a size of the top of the flow blocking island 13 distal to the substrate 10 is about 5 μm to 10 μm, and a size of the bottom of the flow blocking island 13 proximal to the substrate 10 is about 20 μm; and optionally, a plurality of flow blocking islands 13 may be provided between the cathode soldered electrode 12 and the anode soldered electrode 11, so as to improve the effect of blocking the following of the silver paste as much as possible.

Figure 7:
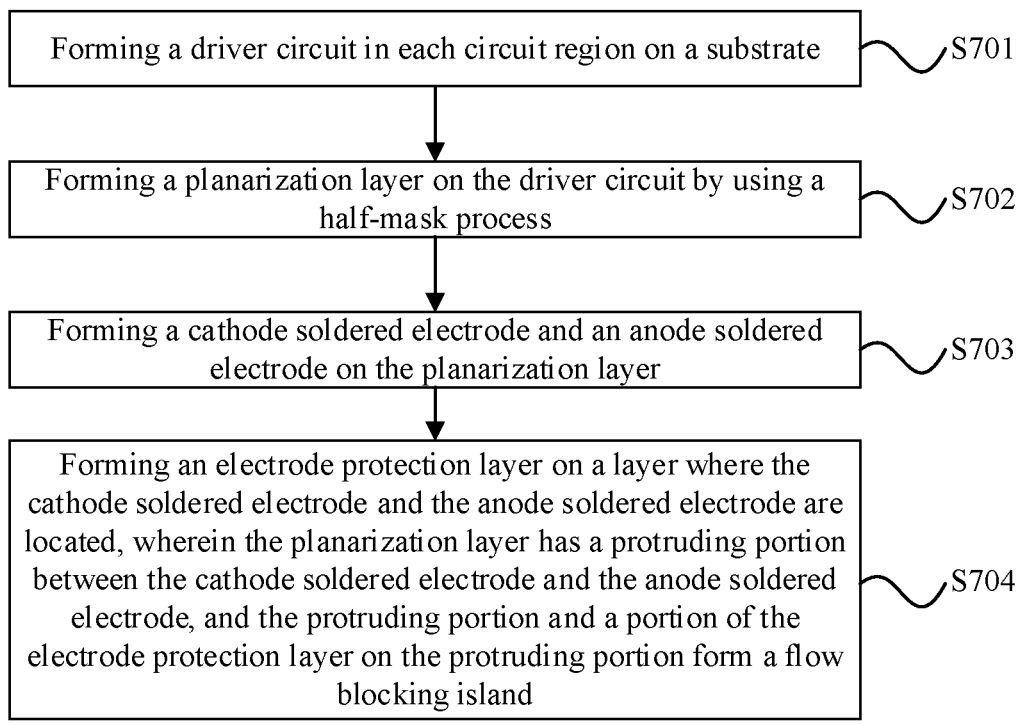
FIG. 7 is a schematic flowchart of a method for manufacturing a circuit backplane of a display panel according to an embodiment of the present disclosure.

Referring to FIG. 7, based on the same inventive concept, an embodiment of the present disclosure provides a method for manufacturing a circuit backplane of a display panel, and the method may include the following steps S701 to S704.

Step S701 includes forming a driver circuit in each circuit region on the substrate 10.

Step S702 includes forming a planarization layer on the driver circuit by using a half-mask process.

Step S703 includes forming a cathode soldered electrode 12 and an anode soldered electrode 11 on the planarization layer.

Step S704 includes forming an electrode protection layer on a layer where the cathode soldered electrode 12 and the anode soldered electrode 11 are located. The planarization layer has a protruding portion between the cathode soldered electrode 12 and the anode soldered electrode 11, and the protruding portion and a portion of the electrode protection layer on the protruding portion form a flow blocking island 13.

In an embodiment of the present disclosure, during manufacturing a circuit backplane of a display panel, a buffer layer, a driver circuit, a first insulating layer, a second insulating layer, gates, a source, and a drain may be formed on the substrate 10 firstly by conventional processes, and then a planarization layer may be formed. Specifically, the planarization layer may be formed on the driver circuit by using a half-mask process, such that the planarization layer has a protruding portion with a height of about 1 μm to 2 μm at a fixed position, and a cathode soldered electrode 12 and an anode soldered electrode 11 may be formed at two sides of the fixed position, respectively. An angle between the protruding portion and the substrate 10 is in a range of [50°, 80°] (i.e., 50°≤the angle≤80°). That is, an angle between a slope surface of the protruding portion proximal to the cathode soldered electrode 12 or a slope surface of the protruding portion proximal to the anode soldered electrode 11 and the substrate 10 is in a range of [50°, 80°] (i.e., 50°≤the angle≤80°).

After the protruding portion is formed, an electrode protection layer is formed on the layer where the cathode soldered electrode 12 and the anode soldered electrode 11 are located, to have a thickness greater than a thickness of an electrode protection layer in the related art. The thickness of the electrode protection layer according to the present embodiment of the present disclosure may increase from 2000 Å as in the related art to about 5,000 Å. In this way, the protruding portion and the portion of the electrode protection layer located on the protruding portion form the flow blocking island 13, thereby blocking the flowing of the silver paste as much as possible.

In a possible embodiment, the step of forming an electrode protection layer on a layer where the cathode soldered electrode 12 and the anode soldered electrode 11 are located may include: forming a plurality of flow blocking grooves 30 in a portion of the electrode protection layer on each of the slope surfaces, such that a size of an opening of each of the plurality of flow blocking grooves 30 is 2 μm to 10 μm, thereby consuming the flow force of the silver paste as much as possible. A structure of a circuit backplane manufactured by the method for manufacturing a circuit backplane of a display panel may be referred to the above embodiments of the circuit backplane of the display panel, and repeated descriptions thereof are omitted.

Based on the same inventive concept, an embodiment of the present disclosure provides a display panel including the circuit backplane according to any one of the above-described embodiments of the present disclosure and a plurality of micro LEDs. An anode and a cathode of each of the plurality of micro LEDs are respectively fixed to the anode soldered electrode 11 and the cathode soldered electrode 12 in a corresponding circuit region of the circuit backplane by using the silver paste. An embodiment of the display panel may be referred to the above-described embodiments of the circuit backplane of a display panel, and repeated descriptions thereof are omitted.

It will be apparent to one of ordinary skill in the art that various changes and modifications may be made to the foregoing embodiments of the present disclosure without departing from the spirit and scope of the present disclosure. Thus, it is intended that the present disclosure also encompass such modifications and variations as long as they fall within the scope of the present disclosure as defined by the appended claims and their equivalents.

What is claimed is:

1. A circuit backplane of a display panel, comprising a substrate and a plurality of circuit regions on the substrate, wherein
    each of the plurality of circuit regions comprises a cathode soldered electrode, an anode soldered electrode, and a flow blocking island that are on the substrate;
    the flow blocking island is between the cathode soldered electrode and the anode soldered electrode, and in a thickness direction of the circuit backplane, a height of the flow blocking island is greater than each of a height of the cathode soldered electrode and a height of the anode soldered electrode; and
    a shape of a cross-section of the flow blocking island taken along the thickness direction of the circuit backplane is a trapezoid, two parallel sides of the trapezoid are parallel to the substrate, respectively, and an angle between any one of two non-parallel sides of the trapezoid and the substrate is in a range of [50°, 80°].

2. The circuit backplane according to claim 1, wherein each of the plurality of circuit regions further comprises: a drive circuit on the substrate, a planarization layer between the drive circuit and a layer where the cathode soldered electrode and the anode soldered electrode are located, and an electrode protection layer on the layer where the cathode soldered electrode and the anode soldered electrode are located;
    wherein the flow blocking island comprises a protruding portion of the planarization layer between the cathode soldered electrode and the anode soldered electrode, and a portion of the electrode protection layer on the protruding portion.

3. The circuit backplane according to claim 2, wherein the protruding portion has slope surfaces proximal to the cathode soldered electrode and the anode soldered electrode, respectively.

4. The circuit backplane according to claim 3, further comprising a plurality of flow blocking grooves in a portion of the electrode protection layer on each slope surface.

5. The circuit backplane according to claim 4, wherein an orthographic projection of each of the plurality of flow blocking grooves on the substrate is a circular arc, a circle center of the circular arc of each of the flow blocking grooves on the slope surface proximal to the cathode soldered electrode is proximal to the cathode soldered electrode, and a circle center of the circular arc of each of the flow blocking grooves on the slope surface proximal to the anode soldered electrode is proximal to the anode soldered electrode.

6. The electrical circuit backplane according to claim 4, wherein the electrode protection layer has a thickness in a range of [3,500 Å, 6,500 Å].

7. A display panel, comprising the circuit backplane according to claim 1 and a plurality of micro LEDs, wherein an anode and a cathode of each of the plurality of micro LEDs are respectively fixed to the anode soldered electrode and the cathode soldered electrode in a corresponding circuit region of the circuit backplane by silver paste.

8. The circuit backplane according to claim 1, further comprising a plurality of flow blocking grooves in a portion of the electrode protection layer on each slope surface.

9. A method for manufacturing a circuit backplane of a display panel, comprising:
  forming a driver circuit in each circuit region on a substrate;
  forming a planarization layer on the driver circuit by using a half-mask process;
  forming a cathode soldered electrode and an anode soldered electrode on the planarization layer; and
  forming an electrode protection layer on a layer where the cathode soldered electrode and the anode soldered electrode are located;
  wherein the planarization layer has a protruding portion between the cathode soldered electrode and the anode soldered electrode, and the protruding portion and a portion of the electrode protection layer on the protruding portion form a flow blocking island; and
  a shape of a cross-section of the flow blocking island taken along the thickness direction of the circuit backplane is a trapezoid, two parallel sides of the trapezoid are parallel to the substrate, respectively, and an angle between any one of two non-parallel sides of the trapezoid and the substrate is in a range of [50°, 80°].

10. The method according to claim 9, wherein the forming an electrode protection layer on a layer where the cathode soldered electrode and the anode soldered electrode are located comprises:
  forming a plurality of flow blocking grooves in a portion of the electrode protection layer on each of slope surfaces of the protruding portion, wherein the slope surfaces are proximal to the cathode soldered electrode and the anode soldered electrode, respectively.

11. The method according to claim 10, wherein an orthographic projection of each of the plurality of flow blocking grooves on the substrate is a circular arc, a circle center of the circular arc of each of the flow blocking grooves on the slope surface proximal to the cathode soldered electrode is proximal to the cathode soldered electrode, and a circle center of the circular arc of each of the flow blocking grooves on the slope surface proximal to the anode soldered electrode is proximal to the anode soldered electrode.

12. The method according to claim 10, wherein the electrode protection layer has a thickness in a range of [3,500 Å, 6,500 Å].

\* \* \* \* \*